United States Patent [19]

Torii et al.

[11] 4,368,402

[45] Jan. 11, 1983

[54] H-TYPE CERAMIC RESONATOR

[75] Inventors: Michihiro Torii, Hamamatsu; Kohei Hirukawa, Kosai; Ryoji Tsuchiya, Hamamatsu; Hiroshi Urata; Isamu Sasaki, both of Kosai; Kunio Esaki, Kosai, all of Japan

[73] Assignee: Fuji Electrochemical Co., Ltd., Tokyo, Japan

[21] Appl. No.: 279,615

[22] Filed: Jul. 1, 1981

[30] Foreign Application Priority Data

Jul. 2, 1980 [JP] Japan .............................. 55-92051[U]
Jul. 17, 1980 [JP] Japan ........................... 55-101007[U]
Jul. 24, 1980 [JP] Japan ................................. 55-101462

[51] Int. Cl.³ .......................... H01L 41/04; H03H 9/02
[52] U.S. Cl. ..................................... 310/367; 310/353; 310/359; 310/366; 333/197
[58] Field of Search ............... 310/365, 366, 367, 368, 310/370, 351–353, 357–359; 333/186, 187, 197, 200

[56] References Cited

U.S. PATENT DOCUMENTS

| | | | |
|---|---|---|---|
| 3,015,789 | 1/1962 | Honda et al. | 333/187 |
| 3,086,183 | 4/1963 | Schöfer | 333/197 |
| 3,146,415 | 8/1964 | Albsmeier et al. | 310/368 X |
| 3,189,852 | 6/1965 | Tsuchiya | 333/197 |
| 3,242,445 | 3/1966 | Kameya | 333/186 |
| 3,281,725 | 10/1966 | Albsmeier | 333/197 |
| 3,358,249 | 12/1967 | Kawakami | 333/197 |

Primary Examiner—William M. Shoop
Assistant Examiner—Peter S. Wong
Attorney, Agent, or Firm—Fleit & Jacobson

[57] ABSTRACT

An H-type ceramic resonator having two resonating leaves, a connecting leaf for bridging the two resonating leaves to form an H-shape, and electrodes disposed on at least both surfaces of the resonating leaves. The resonator has a dimensional relationship which falls within the following equities:

$$B_2/B_3 = 4 \text{ to } 6,$$

$$B_1/B_3 = 2 \text{ to } 4, \text{ and}$$

$$L/B_1 = 5 \text{ to } 6$$

wherein L is a length of each of the resonating leaves, $B_1$ is a width of each of the resonating leaves, $B_2$ is a distance between the two resonating leaves, and $B_3$ is a width of the connecting leaf.

6 Claims, 10 Drawing Figures

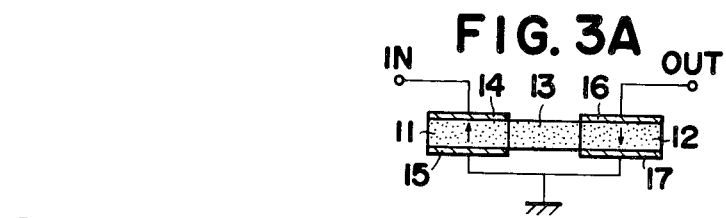
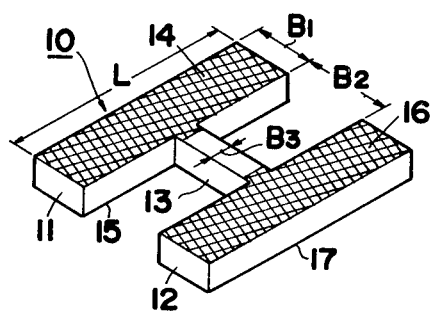
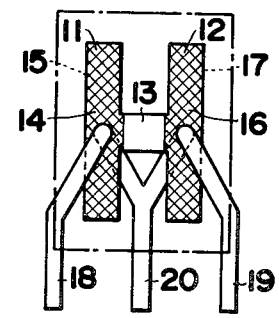
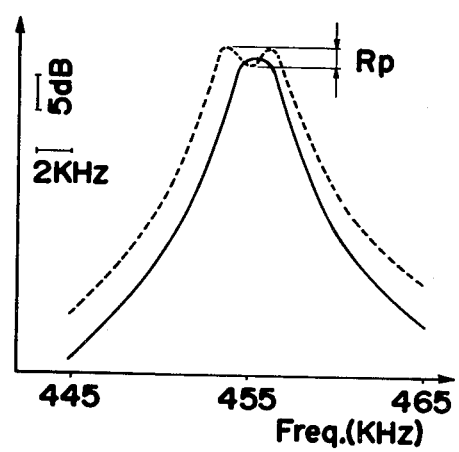
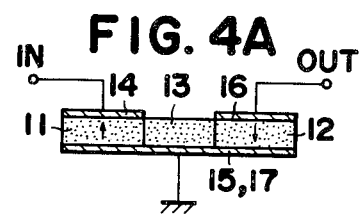
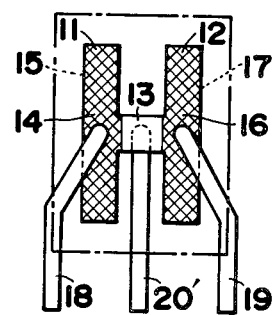

H-TYPE CERAMIC RESONATOR

BACKGROUND OF THE INVENTION

The present invention relates in general to an H-type ceramic resonator and more particularly to an H-type monolithic resonator of piezoelectric materials for, for example, an electro-mechanical filter.

An H-type ceramic resonator is known and has two portions or leaves which resonate in their lengthwise direction, and a connecting portion or leaf bridging the two leaves at their intermediate portion to form an H-shape, the connecting leaf being made of the same material, and has the same thickness, as the two resonating leaves. Electrodes are disposed on both upper and lower surfaces of the resonating leaves.

Many attempts have been made to develop the H-type ceramic resonator, but have not yet been successfully applied for a practical use. One of the reasons of it is that the conventional H-type resonators have a double humped transmission characteristic with a "ripple" of several decibels (dB), wherein the term "ripple" represents a difference in attenuation between a summit of a hump or peak of a transmission characteristic curve and a valley or trough positioned between the two humps, as illustrated by Rp in FIG. 2. A small ripple of 0.5 dB or less would be negligible, but a ripple of 1.0 dB and more makes it difficult to carry out a tracking adjustment at 455 KHz for an intermediate frequency filter such as for AM (amplitude modulation) radios. Moreover, the ripple produces a distortion in transmission to result in deterioration in tone of radio outputs.

SUMMARY OF THE INVENTION

An object of the present invention is to provide an improved H-type ceramic resonator which has a single humped, desired transmission characteristic.

Another object of the present invention is to provide an H-type ceramic resonator which permits an easy tracking adjustment at an applied frequency band.

An H-type ceramic resonator according to the present invention has two resonating leaves and a connecting leaf for bridging the two resonating leaves to form an H-shape, and electrodes disposed on at least both surfaces of the resonating leaves. The resonator has a dimensional relationship which falls within the following equities:

$B_2/B_3 = 4$ to 6, $B_1/B_3 = 2$ to 4, and $L/B_1 = 5$ to 6

Wherein L is a length of each of the resonating leaves, $B_1$ is a width of each of the resonating leaves, $B_2$ is a distance between the two resonating leaves, and $B_3$ is a width of the connecting leaf.

It is preferred that values of $B_2/B_3$, $B_1/B_3$ and $L/B_1$ be determined to fall within the ranges of 4 to 5, 2.6 to 2.8 and 5.4 to 5.6, respectively.

In order to establish a three-terminal packaging of the H-type resonator to form a three-terminal filter assembly, it is preferred that the ceramic resonator be polarized such that one resonating leaf has a polarization which is opposite to that of the other resonating leaf. In this case, the lower electrodes which are disposed on the same plane of the resonating leaves are connected in common to the ground.

BRIEF DESCRIPTION OF THE DRAWINGS

FIG. 1 is a perspective view of a general H-type ceramic resonator, showing also dimensional references of portions of the inventive H-type resonator.

FIG. 2 is a diagram showing a transmission characteristic curve according to the inventive H-type resonator and a similar curve by the conventional H-type resonator.

FIGS. 3A and 3B are somewhat diagrammatic illustrations showing the polarization and electric circuitry applicable to a practical use, in which FIG. 3A shows also the circuit for measuring the data shown in FIG. 2.

FIGS. 4A and 4B are diagrammatic illustrations of a modified structure of terminals and electric circuitry thereof, showing electrodes formed not only on the resonating leaves but also on one surface of a connecting leaf which connects the two resonating leaves.

DETAILED DESCRIPTION OF THE INVENTION

Figure 5:
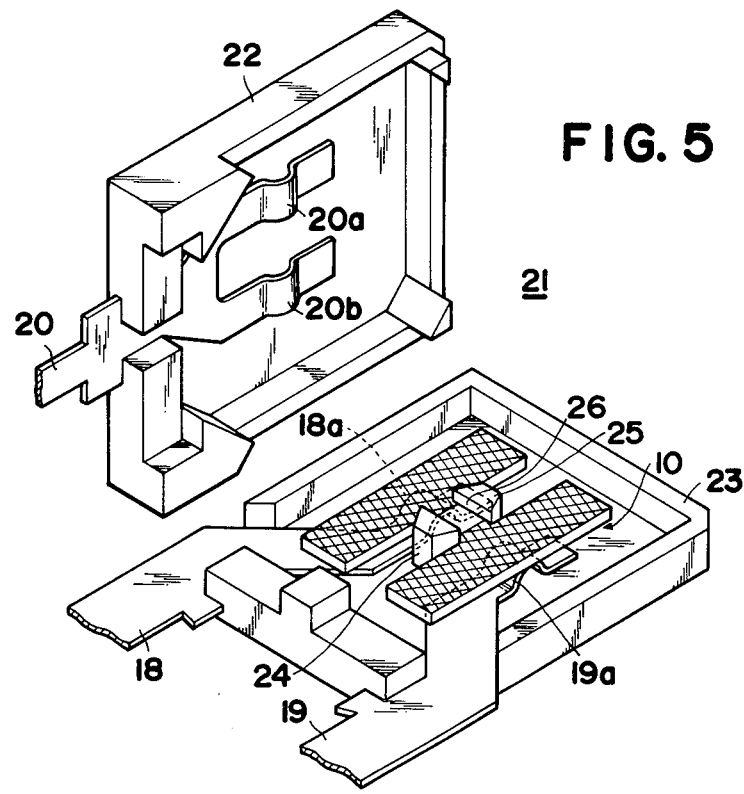
FIG. 5 is a perspective view of a casing in which the inventive H-type ceramic resonator is mounted.

Referring first to FIG. 1, an H-type ceramic resonator 10 has two parallel resonating leaves 11, 12 of piezoelectric material such as PZT which are interconnected through a connecting leaf 13. The connecting leaf 13, which is preferably formed integral with the resonating leaves 11 and 12, projects from a middle portion of each of the resonating leaves and is made of the same material as the resonating leaves 11, 12. Further, the connecting leaf has the same thickness as the resonating leaves. Thus, a resonator in the form of an H-shape is formed. On both surfaces of the thus formed H-type resonator 10 is disposed electrode patterns 14, 15, 16, 17. The electrodes are formed at least on the upper and lower surfaces of the resonating leaves, but the lower electrodes 15 and 17 may be electrically connected together by forming the lower electrodes in an integral H-shaped fashion such that there may be disposed an electrode material on the lower surface of the connecting leaf 13.

The inventive H-type ceramic resonator is designed to fullfill the following conditions:

$B_2/B_3 = 4$ to 6, $B_1/B_3 = 2$ to 4, and $L/B_1 = 5$ to 6 wherein L and $B_1$ are a length and width of each of the resonating leaves 11, 12, respectively, $B_2$ is a distance between the two resonating leaves 11, 12, and $B_3$ is a width of the connecting leaf 13, as identified in FIG. 1.

Generally, a center frequency of an electromechanical filter is dependent primarily upon a length of the resonating leaves 11, 12. Therefore, if the dimension of the resonating leaves is determined in accordance with a field of application of the resonator, the dimension of the other portions of the H-type resonator will be readily directed by a simple calculation. Through various experiments, the applicants have found that a formation of the aforementioned ripple in the transmission characteristic curve is not caused by a change of the thickness nor a change of the material of the ceramic resonator. Namely, the disadvantageous ripple will not be cancelled by changing the thickness and/or material of the resonator. Of course, however, it should be understood that the material to be employed has a mechanical strength which is large enough for forming the H-type resonator of predetermined dimensions.

Applicable and unapplicable dimensions and dimensional relationship are explained with reference to Tables 1 through 3, which show various dimensional changes and their resulting data of ripples. The tests were conducted by employing a circuit shown in FIG. 3A.

Table 1 is the test results of a ripple (Rp) of a transmission characteristic curve in respect of H-type resonators, wherein the tests were conducted by fixing the length of the resonating leaves 11, 12 to be 4.4 mm and varying the other dimensions ($B_1$, $B_2$ and $B_3$), at a center frequency of 455 KHz.

TABLE 1

| Experiments | | #1 | #2 | #3 | #4 | #5 | #6 | #7 | #8 | #9 | #10 |
|---|---|---|---|---|---|---|---|---|---|---|---|
| | | | | | Sample A | | | | | | |
| Dimension (mm) | $B_1$ | 0.5 | 0.5 | 0.8 | 0.8 | 0.8 | 0.8 | 0.8 | 1.0 | 1.0 | 1.0 |
| | $B_2$ | 2.0 | 2.0 | 0.5 | 1.0 | 1.5 | 2.5 | 3.0 | 2.0 | 2.0 | 2.0 |
| | $B_3$ | 0.2 | 0.3 | 0.3 | 0.3 | 0.3 | 0.3 | 0.3 | 0.2 | 0.3 | 0.4 |
| Ripple (dB) | | 4.0 | 3.0 | 1.0 | 1.0 | 0 | 1.0 | 1.0 | 3.5 | 4.0 | 5.0 |
| (L: 4.4 mm Center Frequency: 455 KHz) | | | | | | | | | | | |

In Table 1, an experiment numbered as 5 shows that dimensional relationship lies within the aforementioned applicable ranges which the applicants of this application have found, and that the thus formed H-type resonator did not produce a ripple at all. The other experiments, which are outside the ranges, exhibited ripples of 1.0 dB and more. By way of example, a transmission characteristic curve by the Experiment 5 is shown by a solid line in FIG. 2 and a transmission characteristic curve by Experiment 2 is shown by a dotted line having a ripple of 3 dB. The attenuations were measured by employing the electrode-terminal structure illustrated in FIGS. 3A and 3B in which two resonating leaves 11, 12 are polarized in different direction as illustrated by arrows in FIG. 3A and the electrodes 14, 16 of an upper surface of the resonating leaves are connected to an input terminal (IN) and an output terminal (OUT) while the electrodes 15, 17 are commonly grounded.

Table 2 shows measured values of ripple of transmission characteristic curve under the conditions that length L of the resonating leaves 11, 12 is 7.6 mm, and a central frequency is 262 KHz. Similarly, Table 3 shows measured values of ripple under the conditions that length L is 15 mm and a central frequency is 133 KHz.

TABLE 2

| Experiments | | #1 | #2 | #3 | #4 | #5 | #6 | #7 | #8 | #9 | #10 |
|---|---|---|---|---|---|---|---|---|---|---|---|
| | | | | | Sample B | | | | | | |
| Dimension (mm) | $B_1$ | 1.0 | 1.0 | 1.4 | 1.4 | 1.4 | 1.4 | 1.4 | 2.0 | 2.0 | 2.0 |
| | $B_2$ | 2.0 | 4.0 | 2.0 | 2.0 | 2.5 | 3.0 | 4.0 | 2.0 | 3.0 | 4.0 |
| | $B_3$ | 0.5 | 1.0 | 1.0 | 0.5 | 0.5 | 0.5 | 0.5 | 0.3 | 0.5 | 1.0 |
| Ripple (dB) | | 3.5 | 3.0 | 1.5 | 0 | 0 | 0 | 1.5 | 2.0 | 2.5 | 5.0 |
| (L: 7.6 mm Central Frequency: 262 KHz) | | | | | | | | | | | |

TABLE 3

| Experiments | | #1 | #2 | #3 | #4 | #5 | #6 | #7 | #8 | #9 | #10 |
|---|---|---|---|---|---|---|---|---|---|---|---|
| | | | | | Sample C | | | | | | |
| Dimension (mm) | $B_1$ | 2.0 | 2.0 | 2.7 | 2.7 | 2.7 | 2.7 | 2.7 | 3.5 | 3.5 | 3.5 |
| | $B_2$ | 3.0 | 5.0 | 3.0 | 3.5 | 4.0 | 4.5 | 5.0 | 3.0 | 3.5 | 4.0 |
| | $B_3$ | 0.5 | 1.0 | 0.5 | 1.0 | 1.0 | 1.0 | 1.0 | 0.5 | 1.0 | 1.0 |
| Ripple (dB) | | 3.0 | 2.5 | 1.5 | 1.0 | 0 | 0 | 0 | 2.0 | 2.5 | 4.0 |
| (L: 15 mm Central Frequency: 133 KHz) | | | | | | | | | | | |

In Table 2, dimensions of Experiments #4, #5 and #6 are within the ranges of the aforementioned applicable ranges and do not exhibit a ripple. Similarly, in Table 3 the dimensions of Experiments #5, #6 and #7 which did not exhibit a ripple fall within the applicable ranges.

It will be understood from the foregoing that a single humped transmission curve can be obtained when the dimensions of the H-type resonator are selected to fall within the aforementioned applicable ranges. Accordingly, when a central frequency of a filter to be used is determined in accordance with a field of application and use, the length of the resonating leaves 11, 12 will be determined in accordance with the predetermined central frequency, and thereafter the dimensional ranges of $B_1$, $B_2$ and $B_3$ will be readily obtained.

In the electrode-terminal structure of FIGS. 3A and 3B, an input lead 18 and an output lead 19 are connected to the upper electrodes 14 and 16, respectively, and a common lead 20 in a H-shape is connected to the lower electrodes 15, 17. This permits a three-terminal filter construction.

FIGS. 4A and 4B show a modified structure of an electrode-terminal structure applicable to the inventive H-type ceramic resonator. In the modified structure, lower electrodes 15, 17 are formed integral in an H-shape and disposed not only on the lower surface of the resonating leaves 11, 12, but also on the lower surface of the connecting leaf 13. The upper electrodes 14, 16 are connected to the input terminal (IN) and the output terminal (OUT), respectively, and the lower electrodes 15, 17 are commonly grounded by a rectilinear common lead 20' which is connected to the lower surface of the connecting leaf 13. Similar to the resonator of FIGS. 3A and 3B, the resonating leaf 11 is polarized in the direction opposite to the polarization of the other resonating leaf 12.

Figure 6A:
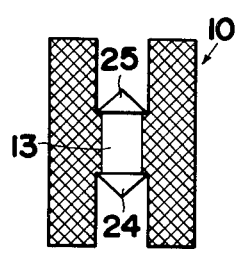
FIGS. 6A, 6B and 6C illustrate schematically modified structure of a device for holding the inventive H-type resonator within the casing.
Figure 6B:
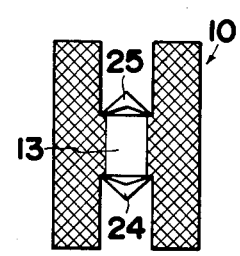
Figure 6C:
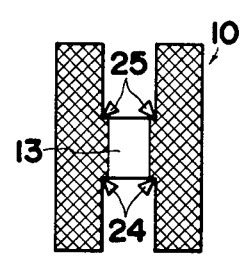

FIG. 5 shows a package 21 for housing therein the inventive H-type ceramic resonator. The package 21 has an upper casing 22 in which a bifurcated or Y-shaped lead wire 20 is secured in position and a lower casing 23 in which input lead wire 18 and output lead wire 1 are symmetrically positioned. The Y-shaped lead 20 has arc shaped projections 20a, 20b at its bifurcated portions, and similarly, the input and output leads have arc shaped projections 18a, 19a so that the inventive H-type resonator may be resiliently held from opposite directions by means of the arc shaped projections. The lower casing 23 has two trapezoidal columns 24, 25 extending from an inner surface of the casing 23 vertically relative to the plane of the inner surface. The columns 24, 25 are in a spaced confronting relation with each other so that the connecting leaf 13 of the H-type resonator 10 is snugly fitted between the spaced columns 24, 25. When the H-type resonator 10 is assembled in the package, the acute edges of the columns 24, 25 project acutely against the four corners of the H-type resonator 10, the four corners being formed by the connecting leaf 13. However, it is not necessary that the all acute edges are projected against all the corresponding corners of the resonator since the columns 24, 25 have a function for merely preventing the resonator 10 from getting out of position. The columns 24, 25 may have a triangle shape as simply illustrated in FIG. 6A, but in order not to disturb a resonation transmission function of the connecting leaf 13, somewhat V-shaped columns as shown in FIG. 6B or four wedge-shaped columns as shown in FIG. 6C are preferred. Thus, the H-type resonator, when assembled, is resiliently held by the arc shaped contacts of the lead wires 18, 19, 20, whereas an undesirable shift or slide of the H-type resonator can be prevented by provision of the acutely formed columns 24, 25 which can contact the four corners of the H-type resonator in a point-contact fashion or a line-contact fashion. Even though the acute edges of the columns 24, 25 are contacted with the corners of the H-type resonator 10, a resonance function of the resonator is not disturbed since the point-contact or line-contact fashion is employed. Accordingly, an insertion loss characteristic can be improved when assembled as a filter.

Though the present invention has been described with reference to the preferred embodiments, many modifications and alterations may be made within the spirit of the invention.

What is claimed is:

1. An H-type ceramic resonator which has two longitudinal, parallel resonating leaves, a connecting leaf for connecting the two resonating leaves in an H-shape and electrodes at least on both surfaces of the resonating leaves, comprising a dimensional relationship which falls within the following ranges:

$B_2/B_3 = 4$ to 6, $B_1/B_3 = 2$ to 4, and $L/B_1 = 5$ to 6 wherein L is a length of each of said resonating leaves, $B_1$ is a width of each of said resonating leaves, $B_2$ is a distance between the said two resonating leaves, and $B_3$ is a width of said connecting leaf.

2. The H-type ceramic resonator according to claim 1, in which said two resonating leaves are polarized such that one of said two resonating leaves is polarized in the opposite direction relative to polarization of the other resonating leaf.

3. The H-type ceramic resonator according to claim 2, in which said electrodes consist of a first upper electrode disposed on an upper surface of one of the two resonating leaves, a second upper electrode disposed on an upper surface of the other resonating leaf of said two resonating leaves, a first lower electrode disposed on a lower surface of said one of the two resonating leaves, and a second lower electrode disposed on a lower surface of the said other resonating leaf, said connecting leaf having an electrode material on its lower surface to thereby electrically connect said first lower electrode and said second lower electrode.

4. The H-type ceramic resonator according to claim 3, in which said first upper electrode is connected to an input terminal, said second upper terminal is connected to an output terminal, and said first lower terminal and said second lower terminal are grounded in common.

5. The H-type ceramic resonator according to claim 1, in which said resonator is nested within a housing, said housing having columns in a spaced confronting relation, said columns each having at least a single acute projection, said projection extending towards a corner formed by said resonating leaves and said connecting leaf.

6. An H-type ceramic resonator which has two longitudinal, parallel resonating leaves, a connecting leaf for connecting the two resonating leaves in an H-shape and electrodes at least on both surfaces of the resonating leaves, comprising a dimensional relationship which falls within the following ranges:

$B_2/B_3 = 4$ to 5, $B_1/B_3 = 2.6$ to 2.8, and $L/B_1 = 5.4$ to 5.6 wherein L is a length of each of said resonating leaves, $B_1$ is a width of each of said resonating leaves, $B_2$ is a distance between the said two resonating leaves, and $B_3$ is a width of said connecting leaf.

* * * * *